US007977187B2

(12) United States Patent
Bernard et al.

(10) Patent No.: US 7,977,187 B2
(45) Date of Patent: Jul. 12, 2011

(54) METHOD OF FABRICATING A BURIED-GATE SEMICONDUCTOR DEVICE AND CORRESPONDING INTEGRATED CIRCUIT

(75) Inventors: Emilie Bernard, Grenoble (FR); Bernard Guillaumot, Le Fontanil (FR); Philippe Coronel, Barraux (FR)

(73) Assignees: STMicroelectronics (Crolles 2) SAS, Crolles Cedex (FR); STMicroelectronics S.A., Montrouge (FR)

( * ) Notice: Subject to any disclaimer, the term of this patent is extended or adjusted under 35 U.S.C. 154(b) by 78 days.

(21) Appl. No.: 12/372,415

(22) Filed: Feb. 17, 2009

(65) Prior Publication Data

US 2009/0212330 A1   Aug. 27, 2009

(30) Foreign Application Priority Data

Feb. 27, 2008  (FR) ...................... 08 51266

(51) Int. Cl.
*H01L 29/772* (2006.01)
(52) U.S. Cl. .. 438/259; 438/282; 257/412; 257/E29.242
(58) Field of Classification Search ............... 438/664, 438/164, 259, 282, 700; 257/256, 288, 412, 257/E21.296, E29.242
See application file for complete search history.

(56) References Cited

U.S. PATENT DOCUMENTS

| 4,803,539 | A  | * | 2/1989  | Psaras et al. ........... 257/742 |
| 5,004,705 | A  | * | 4/1991  | Blackstone ............ 438/455 |
| 6,661,044 | B2 | * | 12/2003 | Jang .................... 257/288 |
| 6,787,425 | B1 | * | 9/2004  | Rotondaro et al. ...... 438/300 |
| 6,864,129 | B2 | * | 3/2005  | Risch et al. ........... 438/157 |
| 7,361,545 | B2 | * | 4/2008  | Li et al. ............... 438/241 |
| 2003/0054637 | A1 | * | 3/2003 | Yang ................... 438/682 |
| 2004/0124468 | A1 | * | 7/2004 | Coronel et al. ......... 257/347 |
| 2004/0227181 | A1 | * | 11/2004 | Yeo et al. ............ 257/328 |
| 2004/0262690 | A1 | * | 12/2004 | Coronel et al. ........ 257/365 |
| 2005/0029603 | A1 |   | 2/2005  | Yu et al. |
| 2005/0121703 | A1 |   | 6/2005  | Hieda et al. |
| 2005/0176186 | A1 |   | 8/2005  | Lee et al. |
| 2005/0224889 | A1 |   | 10/2005 | Oh et al. |
| 2005/0266645 | A1 |   | 12/2005 | Park |
| 2006/0024874 | A1 |   | 2/2006  | Yun et al. |
| 2007/0048938 | A1 | * | 3/2007 | Yun et al. ............. 438/257 |
| 2007/0181959 | A1 |   | 8/2007  | Park et al. |
| 2007/0284670 | A1 | * | 12/2007 | Yamamoto et al. ....... 257/369 |
| 2009/0134470 | A1 | * | 5/2009 | Yang ................... 257/369 |
| 2009/0315182 | A1 | * | 12/2009 | Besser et al. .......... 257/754 |

FOREIGN PATENT DOCUMENTS

| DE | 199 28 564 A1 | 1/2001 |
| FR | 2 853 454 A1 | 10/2004 |
| JP | 2006278369 A | * 10/2006 |

OTHER PUBLICATIONS

French Search Report, FR 08 51266, dated Oct. 27, 2008 (2 pages).

\* cited by examiner

*Primary Examiner* — Matthew Smith
*Assistant Examiner* — Michele Fan
(74) *Attorney, Agent, or Firm* — Andre M. Szuwalski; Gardere Wynne & Sewell LLP (57) ABSTRACT

A semiconductor device includes a semiconductive channel region and a gate region. The gate region has at least one buried part extending under the channel region. The buried part of the gate region is formed by forming a cavity under the channel region. That cavity is at least partial filled with silicon and a metal. An annealing step is performed so as to form a silicide of said metal in the cavity. The result is a totally silicided buried gate for the semiconductor device.

25 Claims, 12 Drawing Sheets

FIG. 9a

METHOD OF FABRICATING A BURIED-GATE SEMICONDUCTOR DEVICE AND CORRESPONDING INTEGRATED CIRCUIT

PRIORITY CLAIM

The present application is a translation of and claims priority from French Application for Patent No. 08 51266 of the same title filed Feb. 27, 2008, the disclosure of which is hereby incorporated by reference.

BACKGROUND OF THE INVENTION

1. Technical Field of the Invention

The present invention relates to integrated circuits, and more specifically buried-gate semiconductor devices, that is, those in which at least a part of the gate region is placed under the channel region.

2. Description of Related Art

Among the so-called buried gate semiconductor devices, there are double planar gate devices, that is, devices in which the gate region comprises two gates, one of which is located above the channel region and the other of which is located below the channel region, and the so-called GAA (Gate All Around) devices, in which the gate region is formed by a single part and embeds the channel region.

The buried gate devices, whether double gate or not, are particularly advantageous for channel lengths of less than 50 nanometers, because they make it possib to eliminate the so-called short channel effects while making it possible to obtain a current intensity that is twice or three times that of a conventional transistor. It will be recalled here that a short channel presents a very small distance (length) between the source and the drain, and that the "short channel" effect is reflected in a lowering of the threshold voltage of the transistor, which can at the extreme limit result in a transistor being obtained that is very difficult to control, and culminate in the "piercing" mode.

The known buried gate devices comprise a gate produced from polysilicon. However, with the reduction of the dimensions for the next semiconductor devices, a polysilicon gate reveals numerous limitations such as polydepletion, an incompatibility with the high-permittivity dielectrics and an excessively high gate resistivity.

One solution is notably to use a metal gate, even if the setting of the threshold voltage of the device requires a metal for which the output work function can be modulated. An example of metal gate devices are the so-called TOSI (totally silicided) devices that are produced from a polysilicon gate on top of which is deposited a metal which diffuses into the polysilicon during an annealing. The siliciding is done vertically and at the end of the method of producing the semiconductor device.

In the case of buried gate devices, the metal is deposited on the lateral walls of the polysilicon forming the gate region or regions. However, a poor formation of the metal silicide is obtained, notably because of the limited diffusion length of the metal in the polysilicon.

SUMMARY OF THE INVENTION

According to one aspect, there is proposed a method of fabricating a semiconductor device comprising a semiconductive channel region and a gate region, the gate region comprising at least one buried part extending under the channel region. The formation of the buried part of the gate region comprises: formation of a cavity under the channel region, at least partial filling of the cavity by at least silicon and a metal, and the formation of a silicide of said metal in the cavity.

The cavity can, for example, be a hollowed-out volume, presenting top and bottom walls, and possibly being opened and accessible from the outside via a lateral wall.

The cavity can thus present a high form factor; that is present, for example, one dimension very much greater than the other two. In this case, the cavity can be accessible via a lateral surface, the sides of which are the two small dimensions, whereas the top wall and the bottom wall comprise the very much larger dimension.

The method makes it possible to form the metal silicide all along the gate region, including in the buried part. In particular, the formation of the metal silicide is less dependent on the diffusion phenomenon or on the form of the cavities when the latter present a high form factor.

Moreover, the polysilicon used to produce the metal silicide is preferably deposited in a way similar to the metal, at the moment of the formation of the gate region, and is not already present before the silicide formation steps.

The step for at least partial filling of the cavity can advantageously comprise a conformal deposition of silicon and of the metal in the cavity, and the formation of the silicide of said metal can comprise an annealing.

The conformal deposition of the silicon and of the metal makes it possible on the one hand to obtain a regular thickness of the deposited material, and on the other hand to be able to deposit the material along the different walls of a cavity presenting a high form factor.

The gate region can advantageously be totally silicided at the time of the annealing for formation of a silicide of said metal. The term "totally silicided" should be understood here to convey the fact that the gate region comprises no part made of polysilicon, that is, comprises no silicon-metal interface likely to limit the electrical conductivity of the gate region.

Advantageously, the relative quantity of silicon and metal deposited in the cavity can be chosen to set the threshold voltage of the semiconductor device.

The threshold voltage of the semiconductor device depends notably on the output work function of the gate material. Now, the output work function of a silicide depends on the relative quantity of silicon and of metal in said silicide. It is then possible to adjust the threshold voltage by adapting the relative quantities of silicon and of metal deposited during the steps for formation of the gate region.

The relative quantity of silicon and metal deposited in the cavity can advantageously be adjusted by an atomic layer deposition of the silicon and/or of the metal in the cavity.

Atomic layer deposition (ALD) makes it possible to deposit a material in atomic layers, notably via a reaction with the surface on which the material is to be deposited. The ALD deposition is notably a conformal deposition which makes it possible to also deposit a material on the internal walls of a cavity. It is then possible to obtain a uniform material thickness along the region where the gate will be formed.

The silicon and the metal can both be deposited by ALD, for example when the cavity is only partially filled by these two materials. In this case, the relative proportion of the two materials is controlled and adjusted during the deposition, according to the desired metal silicide for example.

The filling step can advantageously comprise a complete filling of the cavity with silicon and metal deposited by ALD or chemical vapor deposition (CVD), and the relative quantity of silicon and metal deposited in the cavity can be adjusted by the size of the cavity.

In this case, one of the two materials is deposited by ALD or CVD, then the rest of the cavity is filled with the other material, possibly by another conformal deposition method. The initial size of the cavity and the space left free for the deposition of the second material are then adjusted to make it possible to obtain the desired ratio of silicon and metal for the formation of the silicide.

Advantageously, the formation of the gate can comprise: the formation on the top surface of the substrate of a stack comprising at least one layer of silicon placed above a sacrificial layer formed from a material that is selectively eliminable relative to the silicon, an epitaxial silicon growth on the lateral walls of the stack, an anisotropic etching of the stack so as to etch a part of the epitaxial silicon growth and access at least one of the ends of the sacrificial layer, a selective isotropic etching of the sacrificial layer, the formation, on the walls of the cavity resulting from the isotropic etching, of a layer comprising a dielectric material, the conformal deposition, in the cavity, of a layer comprising silicon, the conformal deposition, in the cavity, of a layer comprising the metal, and an annealing for formation of the silicide of said metal.

As a variant, and notably in order to obtain an embedded gate device, the formation of the gate region can comprise the conformal deposition of silicon and metal around the part of the semiconductive channel region so that the gate region embeds the semiconductive channel region.

According to another aspect, there is proposed a semiconductor device comprising a semiconductive channel region and a gate region, in which the gate region comprises at least one buried part extending under the channel region, and in which the buried part of the gate region comprises a metal silicide.

Advantageously, the gate region can be totally silicided.

The metal silicide of the gate region can comprise a relative proportion of silicon and metal making it possible to obtain a desired threshold voltage for the semiconductor device.

The gate region can embed the channel region.

According to another aspect, there is proposed an integrated circuit comprising a device as described previously.

In accordance with another embodiment, a method of fabricating a semiconductor transistor device is presented. The device comprises a semiconductive channel region and a gate region, the gate region comprising at least one buried part extending under the semiconductive channel region. The method of fabricating comprises: forming a stack comprising a layer of silicon above a sacrificial layer, forming source/drain regions on either end of the stack, selectively etching away the sacrificial layer from either side of the stack to form a cavity, conformally depositing a layer of silicon and a layer of metal in the cavity, and annealing to form a silicide of said metal in the cavity, the silicide being the at least one buried part of the gate region.

BRIEF DESCRIPTION OF THE DRAWINGS

Other advantages and characteristics of the invention will become apparent from studying the detailed description of three embodiments, by no means limiting, and appended drawings, in which:

FIGS. 1 to 10b diagrammatically illustrate the main steps of a first embodiment of the method;

FIGS. 1a to 12b diagrammatically and partially illustrate an embodiment variant.

DETAILED DESCRIPTION OF THE DRAWINGS

There follows a description of an exemplary method of producing an embedded or buried-gate transistor comprising, for example, three semiconductive channel regions, two of which are embedded by the gate region.

Figure 1:
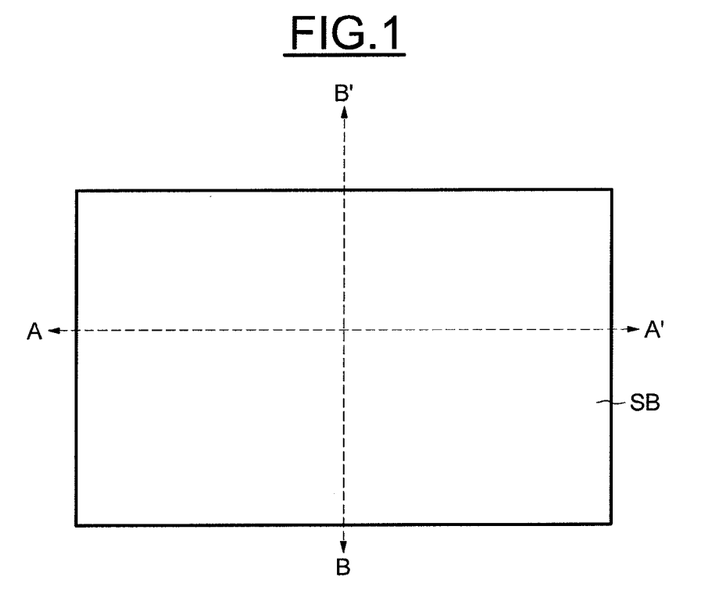

In FIG. 1, the reference SB designates a semiconductive wafer or semiconductive substrate that is represented here in plan view in rectangular form for the purposes of simplification.

In the rest of the figures, those figures labeled with the letter "a" will correspond to a cross-sectional view in the direction AA' of FIG. 1, whereas those labeled with the letter "b" will correspond to a cross-sectional view in the general direction BB'.

Figure 2:
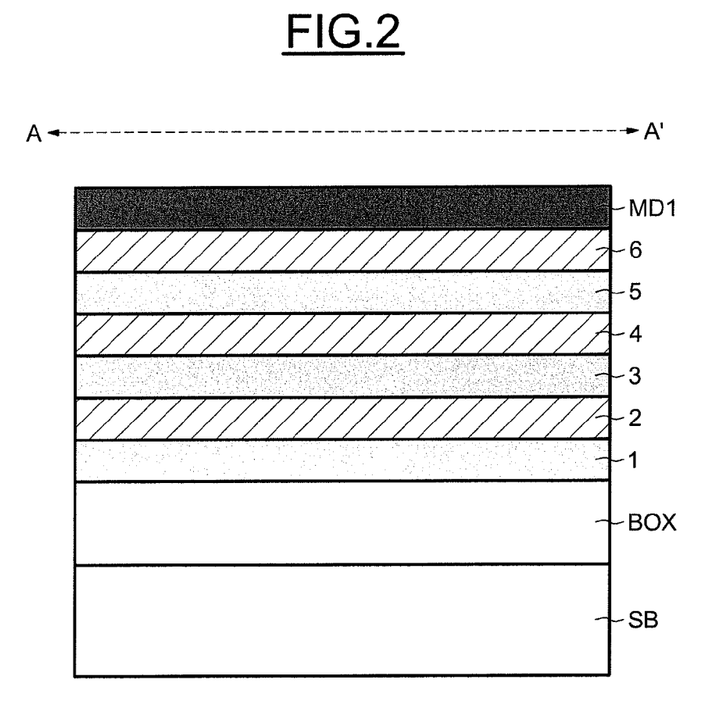

The first phase of the method comprises, as illustrated in FIG. 2, the forming on the substrate SB of a base insulating layer BOX (buried oxide) topped by a stack comprising a first layer of silicon 1, a second layer of silicon 3 encapsulated between two sacrificial layers 2 and 4, and a third layer of silicon 5 encapsulated between the sacrificial layer 4 and a sacrificial layer 6. The sacrificial layers 2, 4 and 6 are for example formed from a silicon/germanium alloy.

The stack is itself topped by a hard mask layer MD1, for example a layer of silicon nitride, made conventionally by deposition.

The formation of these overlaid layers can be obtained, for example, by a molecular bonding technique well known to those skilled in the art. More specifically, the BOX layer is formed by thermal oxidation on the substrate SB whereas the stack of the layers 6, 5, 4, 3, 2 and 1 is formed on a second substrate, for example by non-selective epitaxy. The top surface of the layer 1 is then made to adhere, by molecular bonding, to the top surface of the base insulating layer BOX. After removal of the second substrate, the substrate SB will be topped in succession by the layers BOX, 1, 2, 3, 4, 5 and 6. The hard mask layer MD1 is then formed conventionally by deposition on the layer 6 so as to form the structure illustrated in FIG. 2.

As an indication, the thickness of the BOX layer can be between 100 and 400 nanometers, for example, whereas the thickness of the layers 1, 3, 5 can be between 10 and 30 nanometers for example, and the thickness of the sacrificial layers 2, 4, 6 in place of which, as will be seen in more detail hereinafter, the gate region will be formed, can be between 10 and 70 nanometers depending on the type of semiconductor device formed.

Figure 3A:
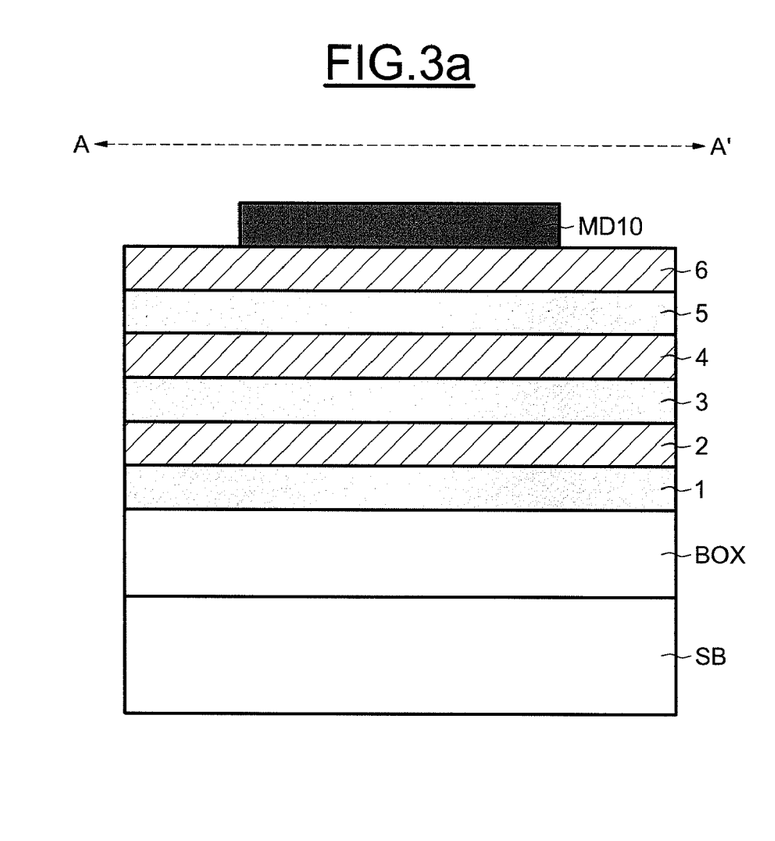
Figure 3B:
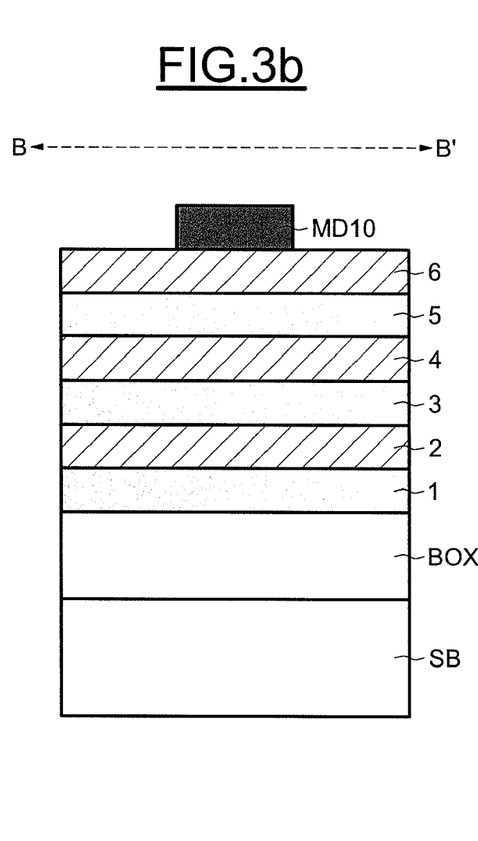

Then, as illustrated in FIGS. 3a and 3b, a block of resin MD10 is formed, by a conventional photolithographic step, in the layer of silicon nitride MD1, and a vertical etch GRV1 (FIGS. 4a and 4b) is made, stopping at the first layer of silicon 1. This etch can be a plasma etch for example. The geometry of the block MD 10 corresponds to the geometry of the future gate of the semiconductor device, that is, the block MD10 will make it possible to define the future length L of the channels of the semiconductor device.

Figure 4A:
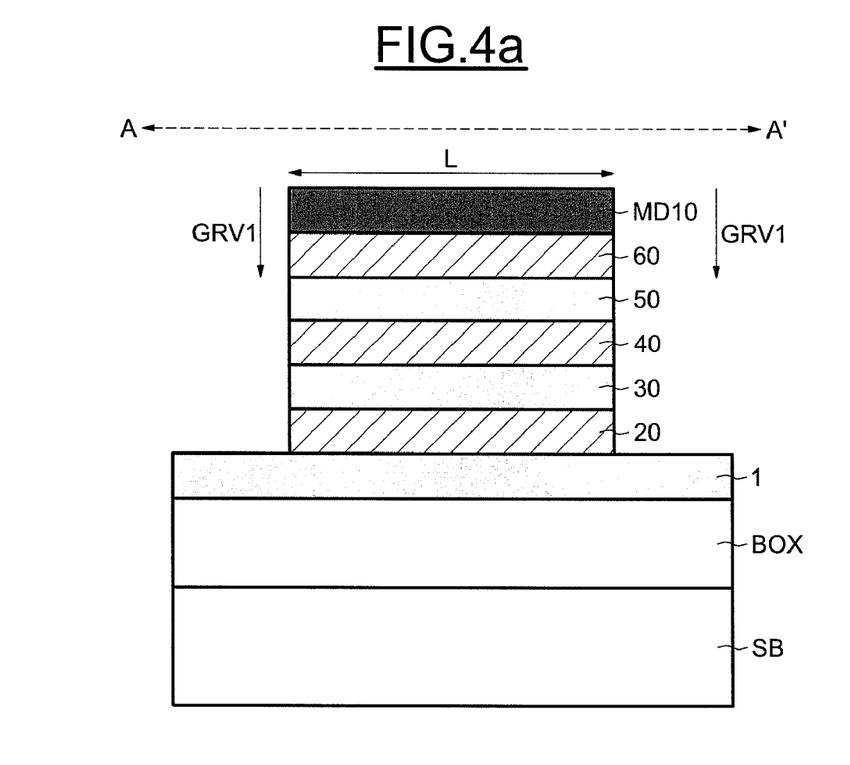
Figure 4B:
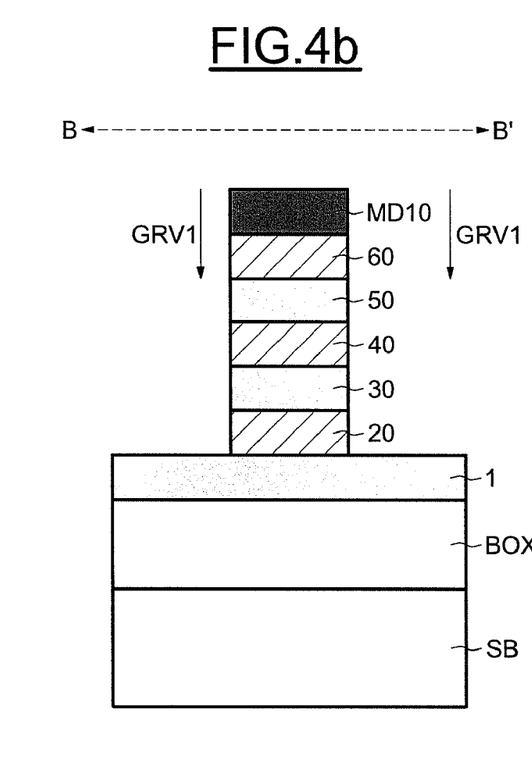

In particular, the length L of the channels will preferably be between 20 nanometers and 60 nanometers, whereas the width W will be between 50 nanometers and 500 nanometers.

Figure 5A:
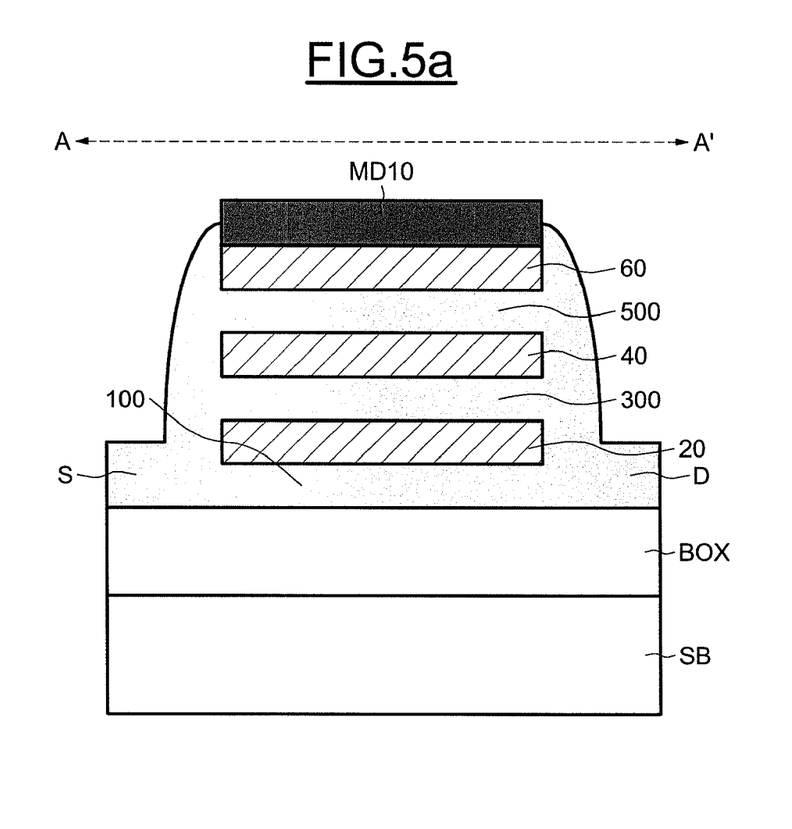

Source S and drain D regions are then grown by epitaxy from the lateral walls of the layers of silicon 30 and 50 and from the top surface of the layer of silicon 1. The source S and drain D regions are linked by the different layers of silicon that thus form the channels 100, 300, 500 of the semiconductor device (FIG. 5a).

Figure 5B:
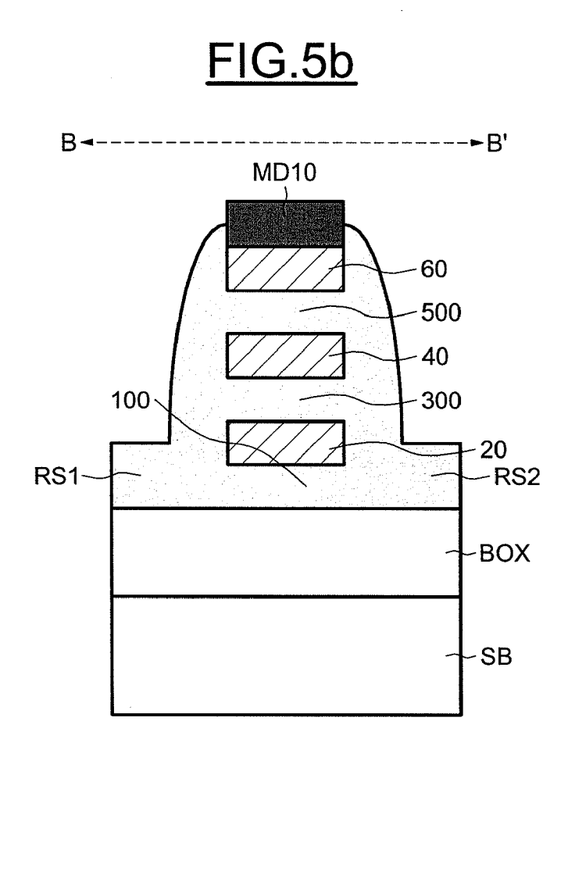

During the formation of the source S and drain D regions, the epitaxial growth of the silicon also leads to the formation of two other regions of silicon RS1 and RS2 (FIG. 5b).

Figure 6A:
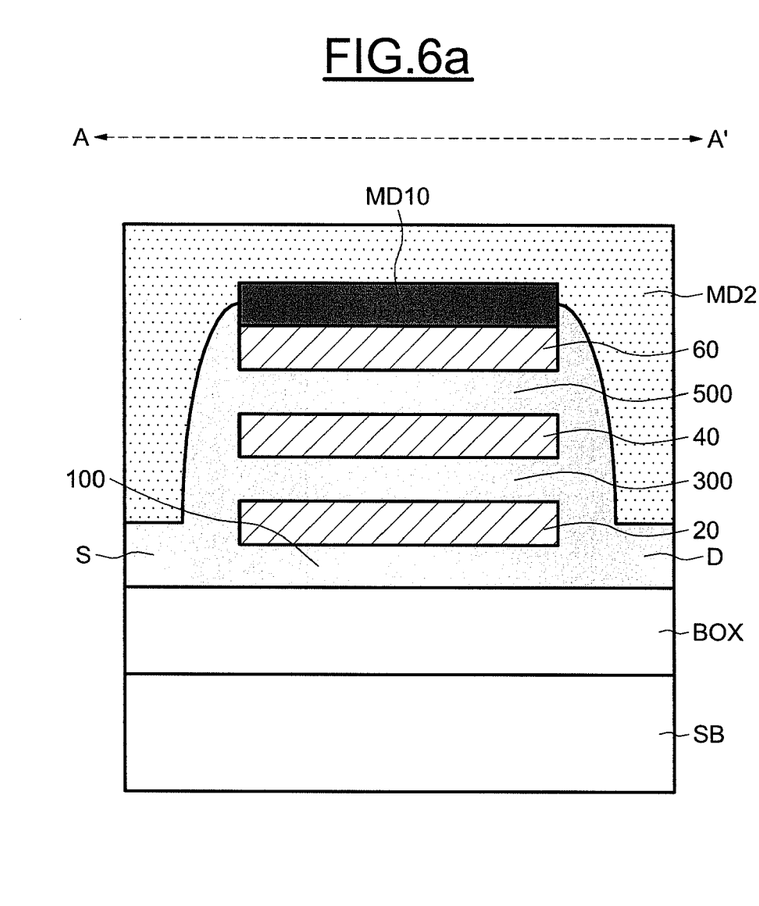
Figure 6B:
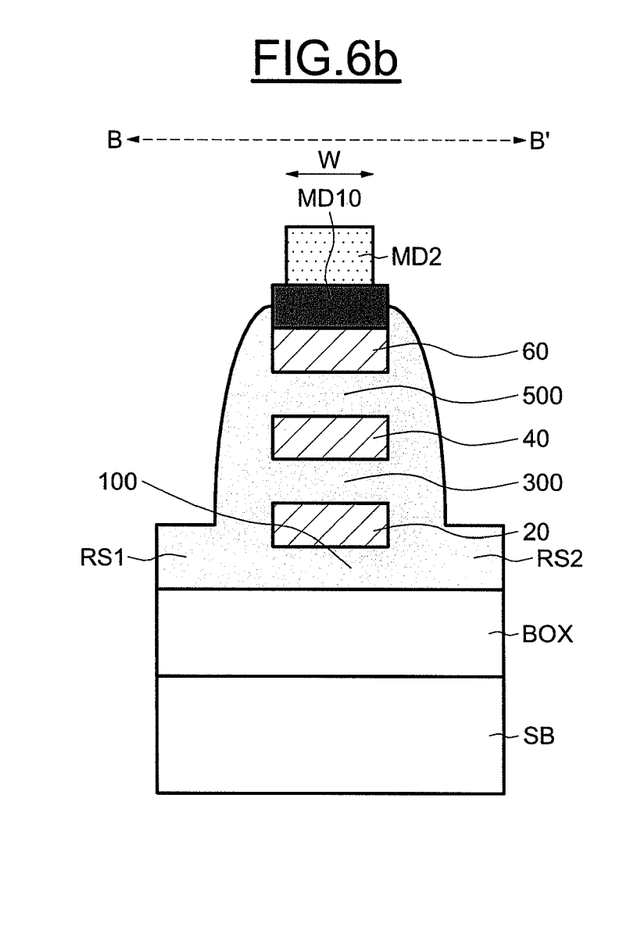

After having deposited a dielectric film, for example of $SiO_2$, on the block of resin MD 10, a second block of resin MD2 is then formed, by using a conventional photolithographic step, so as to reveal at least the regions of silicon RS1 and RS2 (FIGS. 6a and 6b). The second block of resin MD2 will make it possible to define the future width W of the channels of the semiconductor device.

Figure 7A:
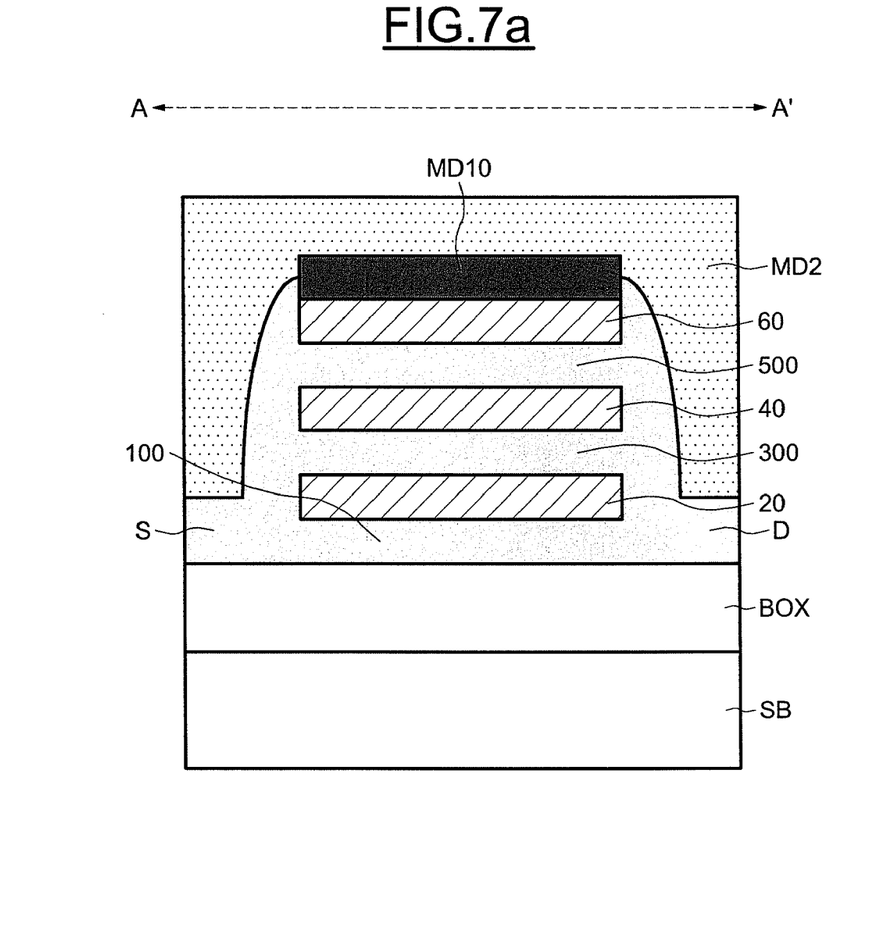
Figure 7B:
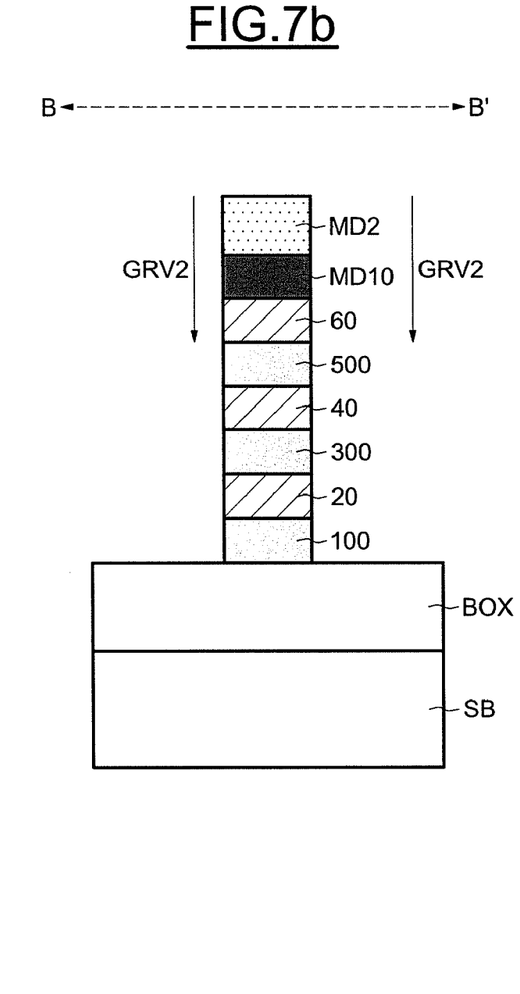

A second etch GRV2 is then made, stopping at the base insulating layer BOX. This etch can be a plasma etch for example (FIGS. 7a and 7b).

The etch GRV2 makes it possible to etch the regions of silicon RS1, RS2, and to access certain of the lateral walls of the sacrificial layers 20, 40 and 60, previously covered by the epitaxial silicon layer. It is then possible, after the etching of the hard mask layer MD2 and with a selective lateral isotropic etching GRL, to etch the three sacrificial layers 20, 40 and 60.

The characteristics of such a lateral etching are well known to those skilled in the art and are the subject of numerous publications, notably the French patent application No. 2,791,178, the disclosure of which is hereby incorporated by reference.

More specifically, it is possible to use, for example, a well-known oxidizing chemical agent such as a 40 ml $HNO_3$ 70%+20 ml $H_2O_2$+5 ml HF 0.5% solution, or even an isotropic plasma attack.

It should be noted here that, although any selectively eliminable material relative to silicon can be used, the alloys $Si_{1-x}Ge_x$ are recommended because they are easily selectively eliminable by such an oxidizing chemical agent or by an isotropic plasma attack. These alloys also facilitate the epitaxial production of the initial fine layers of silicon 1, 3 and 5.

Figure 8A:
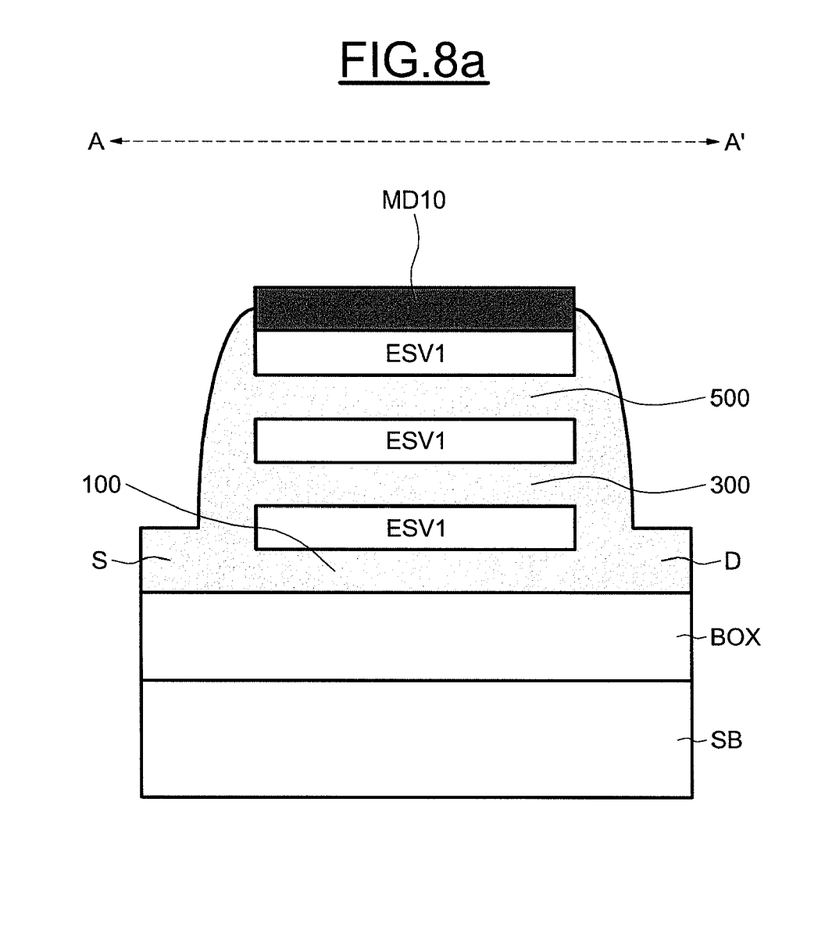
Figure 8B:
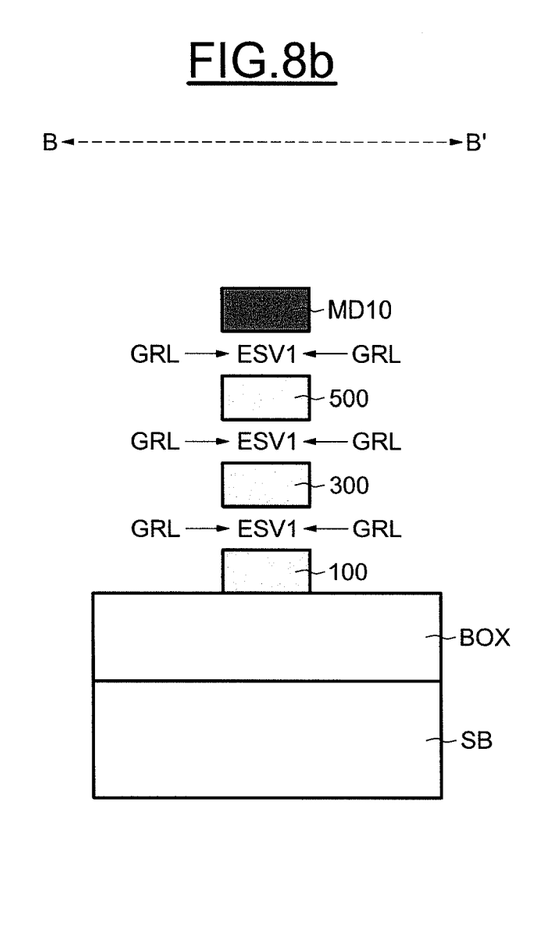

There are then created, as illustrated in FIGS. 8a and 8b, void spaces ESV1 around channels 100, 300 and 500 which form a bridge between the source S and drain D regions. The void spaces ESV1 are cavities which are accessible via the accesses used for the lateral etch GRL, but which are covered by other layers, in the present case either a channel layer or a hard mask layer.

The three sacrificial layers are etched so as to form, in place, the gates of the final device.

Figure 9A:
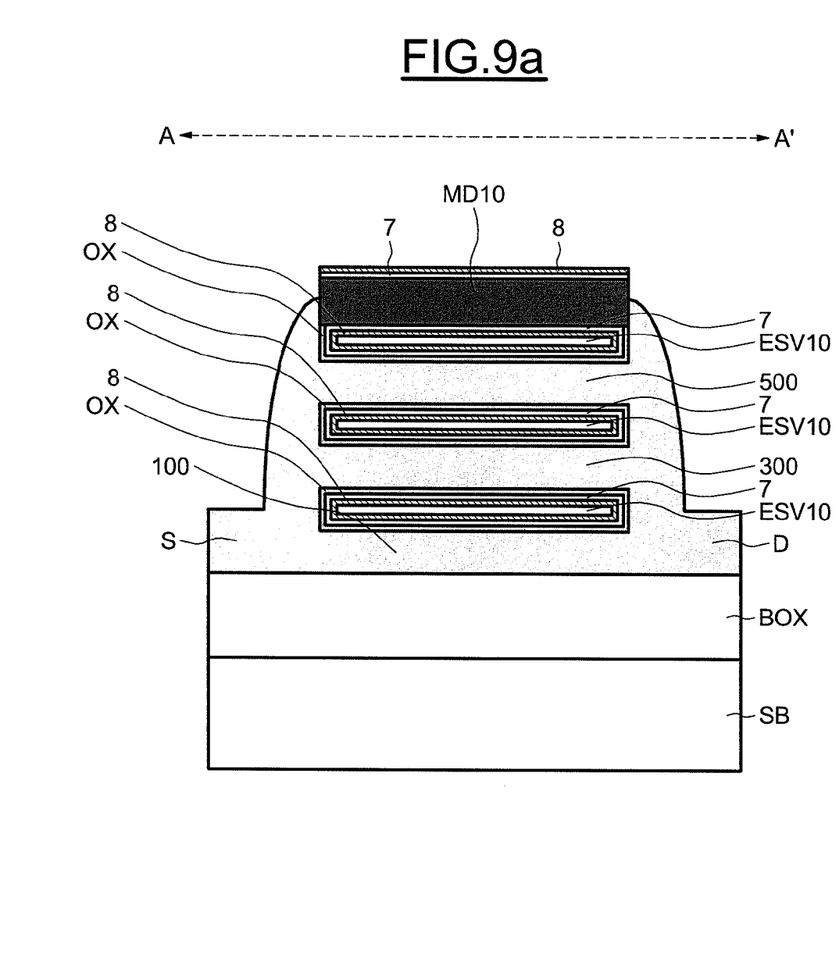
Figure 9B:
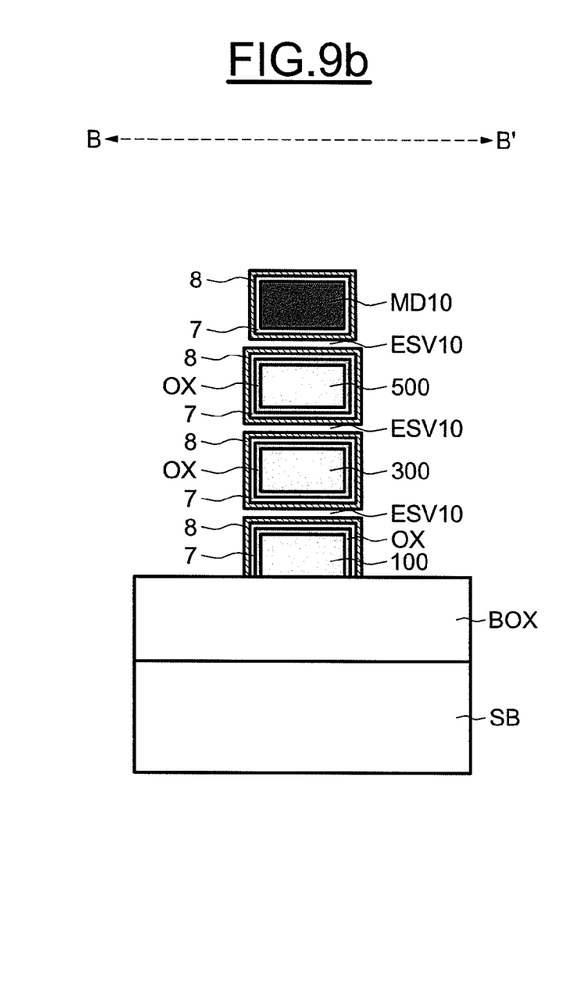

The next step, illustrated in FIGS. 9a and 9b, thus consists in partially filling the cavities or tunnels resulting from the selective isotropic etching of the sacrificial layers. Initially, there is therefore formed on the walls of the void spaces ESV1 or cavities, a layer of dielectric material OX so as to provide total insulation of the sides. In particular, the layer of dielectric material OX forms the gate insulating material of the final semiconductor device.

This layer of insulating dielectric material OX can be obtained, for example, by a high-temperature deposition of an oxide film TEOS. As a variant, it is possible to use as the material an insulating material known to those skilled in the art as BSG (Boro-Silicate Glass) which presents a better etching selectivity relative to the oxide of the BOX layer, than that of a TEOS oxide.

It is also possible to use a thermal oxidation, so as to form on the surface of the silicon sides of the void spaces ESV1 a thin layer OX of silicon oxide.

The void spaces ESV1 are then partially filled by a layer of first material 7 and a layer of second material 8, one of the two materials comprising silicon and the other comprising a metal. In particular, the first and second materials will make it possible to form, after a siliciding annealing, the metal silicide gate.

The first material can be, for example, polysilicon formed by a CVD or ALD deposition, or even a metal material, such as, for example, nickel, titanium or cobalt, which can also be deposited by CVD or ALD depositions. The CVD or ALD depositions are conformal depositions that make it possible to form a layer even on the internal walls of the cavities, with a relatively uniform thickness. The ALD deposition also makes it possible to deposit the material in atomic layers, and therefore on the one hand to more accurately control the quantity of material deposited, and on the other hand to be able to deposit the material also inside cavities of small dimensions. In the present case, it will be assumed that the layer of first material 7 is polysilicon deposited by ALD.

The layer of second material 8 is then deposited. In the example considered, the second material is therefore a metal, for example nickel. As described above, the nickel can be deposited by ALD or CVD.

According to this first embodiment in which the cavities ESV1 are only partially filled, it will be assumed that the nickel is deposited by ALD, like the polysilicon of the layer 7 deposited previously. There thus still remains a void space ESV10 after the formation of the layers 7 and 8 of first and second materials. With the two ALD depositions, the relative quantities of polysilicon and of nickel deposited are adjusted so as to be able to form the metal silicide that presents the desired output work function.

The last step is then the siliciding annealing step during which the layer of first material 7 and the layer of second material 8 form the layer of metal silicide 9, in the present case a layer of nickel silicide. The annealing temperature can be between 300° C. and 800° C., and is equal, for example, to 450° C. During this siliciding step, a metal silicide layer expansion phenomenon may be observed. There is then obtained after the formation of the metal silicide, a void space that is smaller than the void space ESV10. It is also possible for the metal silicide layer expansion phenomenon to lead to the complete filling of the cavities ESV10, as is represented in FIGS. 10a and 10b.

Figure 10A:
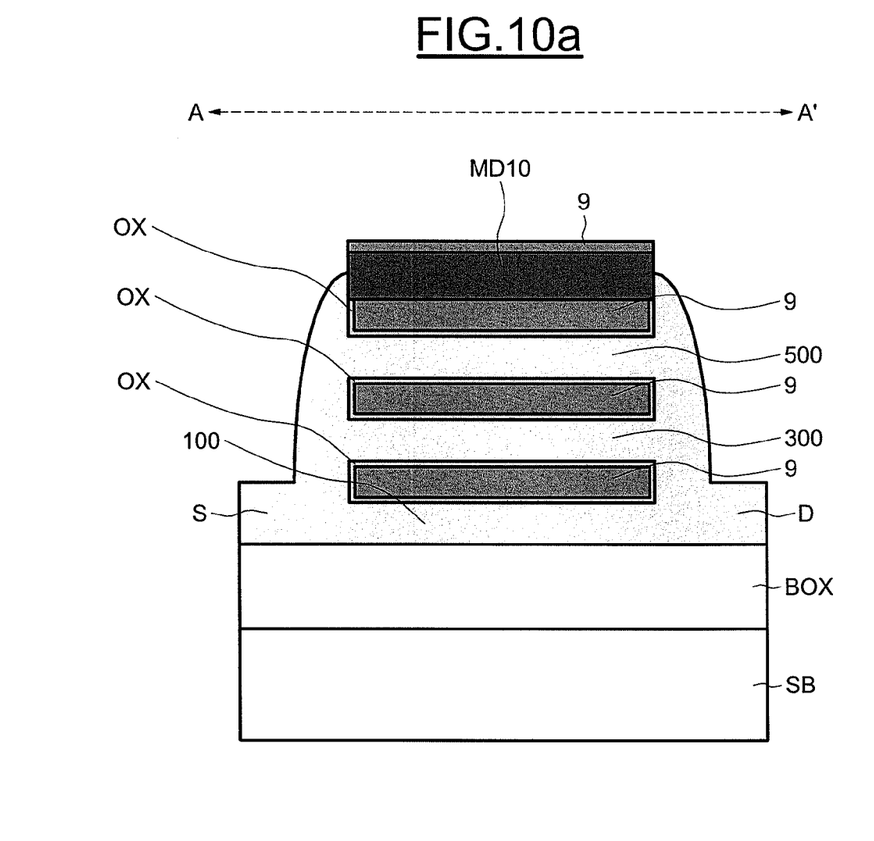
Figure 10B:
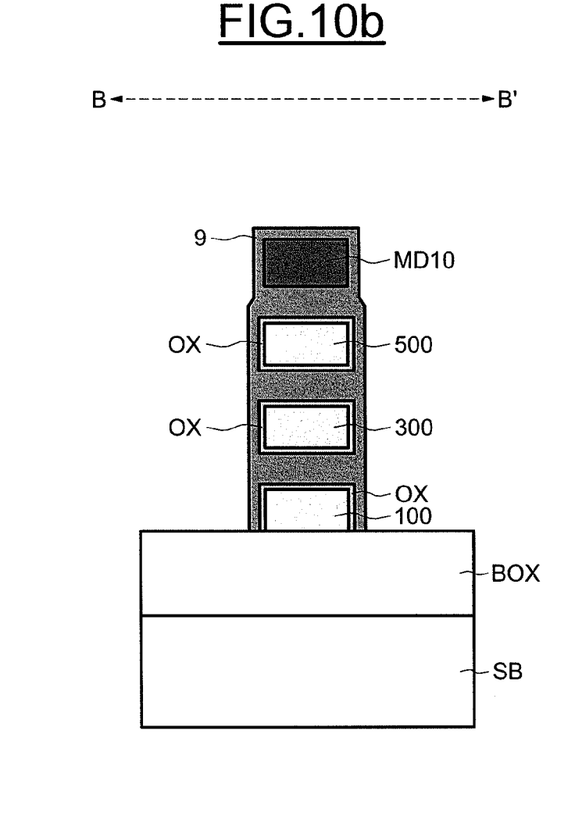

The device obtained in this way comprises, in the embodiment illustrated in FIGS. 10a and 10b, a source region S, a channel region (100, 300, 500), a drain region D and a metal gate region 9. Moreover, the source, channel and drain regions are totally insulated from the substrate SB on the one hand and from the gate region 9 on the other hand, by an insulating coating OX and by the BOX layer. More particularly, in the case described previously, the semiconductor device comprises three channels 100, 300, 500, two of which (300, 500) are embedded by the gate 9. Furthermore, since the gate 9 is formed by metal silicide, it is a metal gate, the output work function of which can be set by the relative proportion of the silicon and of the metal. In particular, the ALD deposition of the polysilicon and of the metal makes it possible to obtain a metal silicide, the composition of which is uniform, in particular in contact with the gate insulating material.

The final step in producing the component consists in conventional touchdowns in the siliciding zones. It should be noted here that such a component can easily be incorporated within an integrated circuit disposed on another wafer for example (Cell On Chip (COC) concept).

Figure 11A:
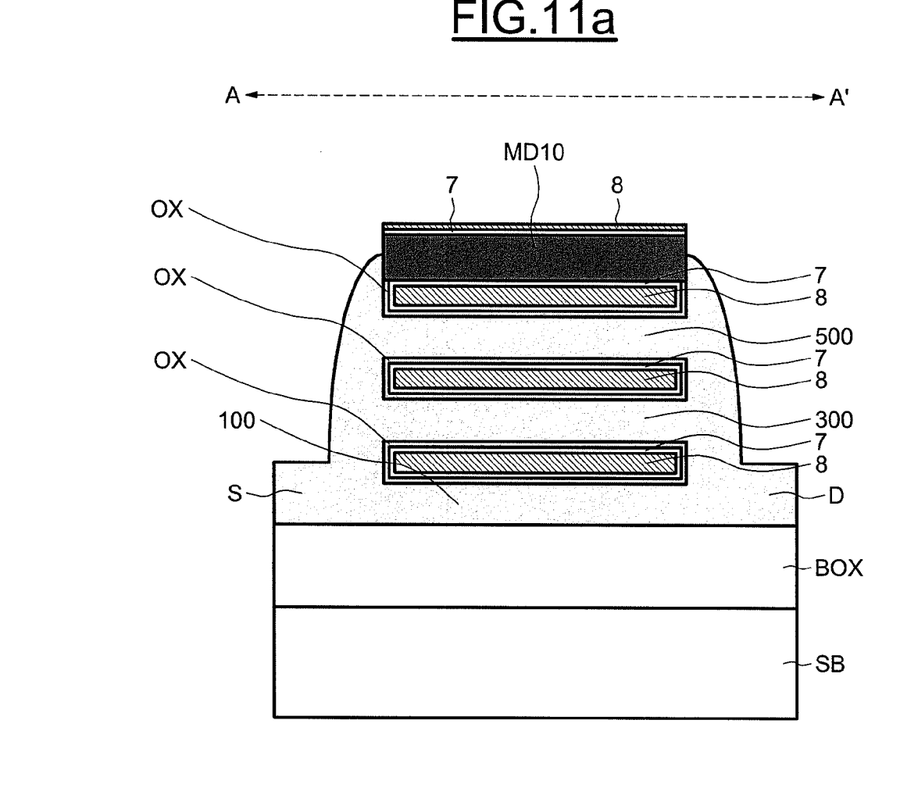
Figure 11B:
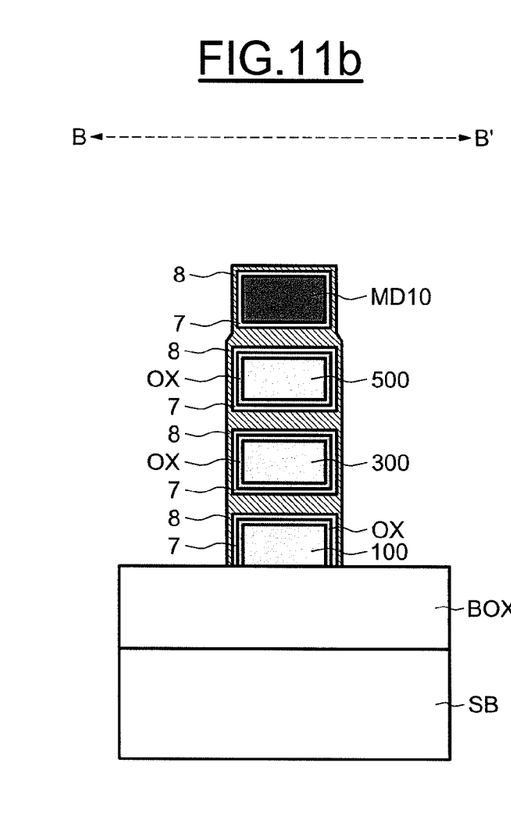

According to a second embodiment, it is also possible to entirely fill the void spaces ESV1 represented in FIGS. 8a and 8b. Thus, from FIGS. 8a and 8b, the step for formation of the layer of second material 8 comprises a deposition making it possible to completely fill the cavities (FIGS. 11a and 11b). The quantity of second material deposited then depends on the size of the cavity and not on the deposition method. Thus, to obtain the desired metal silicide, the size of the cavities ESV1 and the thickness of the layer of first material 7 can be adjusted. Here again, it is possible to deposit said first material by ALD, for a better control of the deposited quantity and therefore of the thickness of the layer 7, then to fill the rest of the cavities by a deposition, for example CVD, of the second material. The CVD deposition makes it possible on the one hand to obtain a conformal deposition in the remaining space of the cavities, and on the other hand, the quantity of second material being determined by the volume to be filled, there is no need to implement a deposition method as precise as ALD deposition. The latter method can, however, still be envisaged for this second embodiment.

Figure 12A:
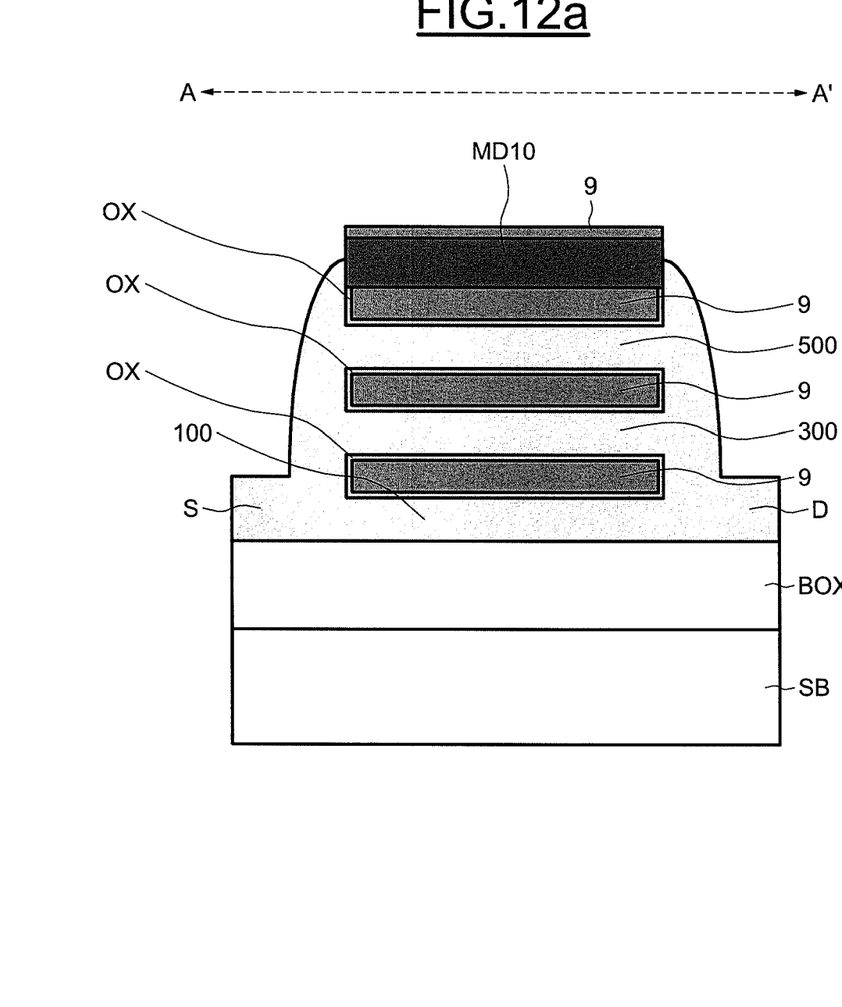
Figure 12B:
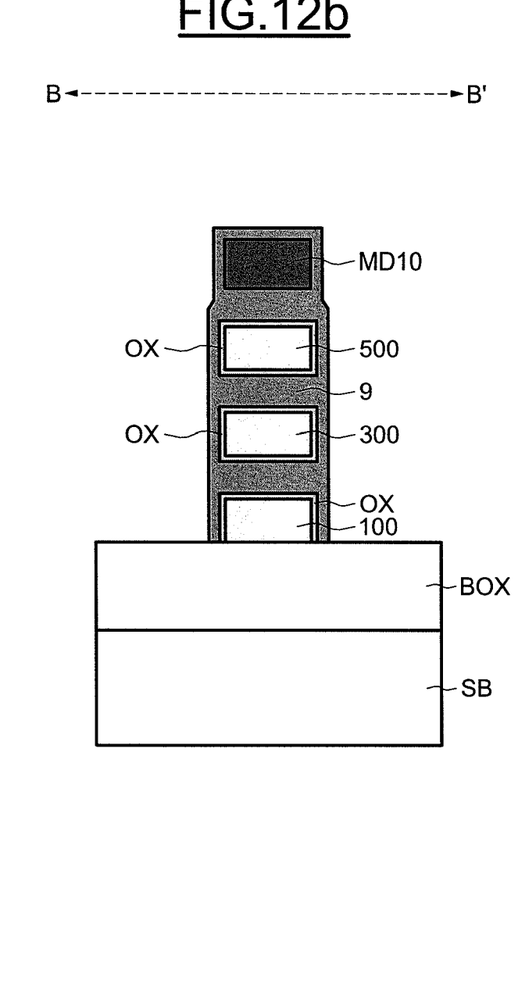

In the siliciding step, the layers 7 and 8 of first and second materials form the layer 9 of metal silicide (FIGS. 12a and 12b). During the siliciding step, and unlike in the first embodiment, the layer of metal silicide 9 can present stresses, notably because of possible variations of volume (for example an expansion) in the formation of the metal silicide from the silicon and the metal. These stresses can, for example, be exploited in the case of positive charge carriers, the mobility of which in a silicon channel increases with the stresses.

According to a third embodiment, it is possible to integrate semiconductor devices of different types (NMOS and PMOS) by simultaneously performing the main steps described previously. In this third embodiment, the type of the semiconductor devices formed is determined by the phase of the gate silicide, that is, the semiconductor devices of different types will be produced in a similar way but with different gate silicide phases. For example, to produce an NMOS semiconductor device with a nickel silicide gate, the phase of the silicide is preferably chosen to be rich in silicon, whereas for a PMOS semiconductor device, a nickel-rich silicide phase will be chosen.

To be able to implement the main steps of the method in a way common to the production of two types of semiconductor devices, the phase of the silicides formed will be determined at the start of the method by the size of the sacrificial layers. Thus, in the first step of the method, there is produced a stack of silicon layers and of sacrificial layers in which the thickness of the sacrificial layers is chosen according to the type of semiconductor device to be produced.

Figure 13:
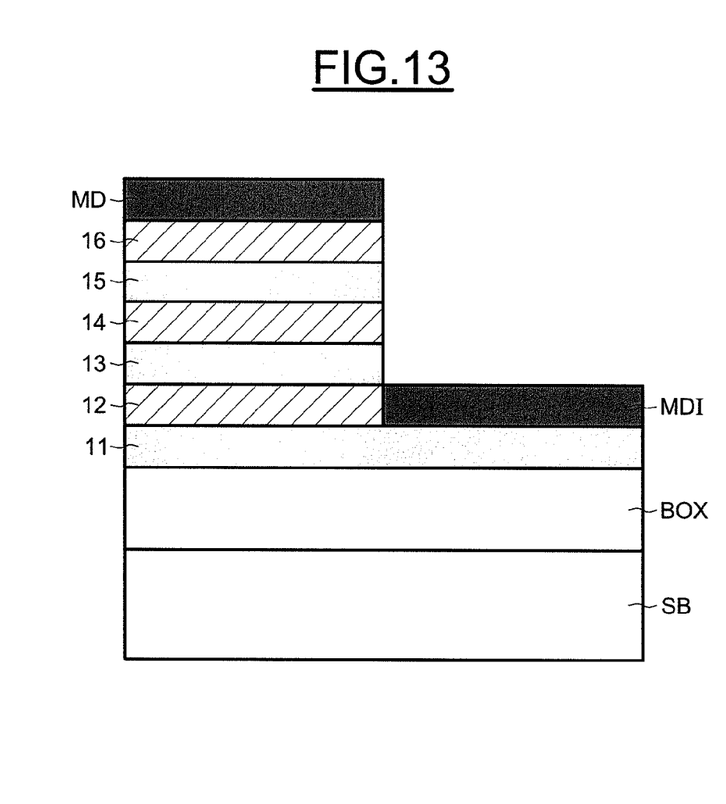
FIGS. 13 and 14 diagrammatically and partially illustrate another embodiment variant.

The first step of the method therefore consists in producing a first layer of silicon 11 on the insulating layer BOX, then covering, with an intermediate hard mask MDI, the zones where the PMOS transistors will be produced. There is then formed, on a non-covered zone, a first stack of layers for the production of an NMOS transistor (FIG. 13). The first stack thus comprises layers of silicon 11, 13, 15 and sacrificial layers 12, 14, 16, the thickness of which is chosen, for example, to be of the order of magnitude of that of the layers of silicon. Finally, a hard mask MD is deposited on top of the first stack as for FIG. 2.

Figure 14:
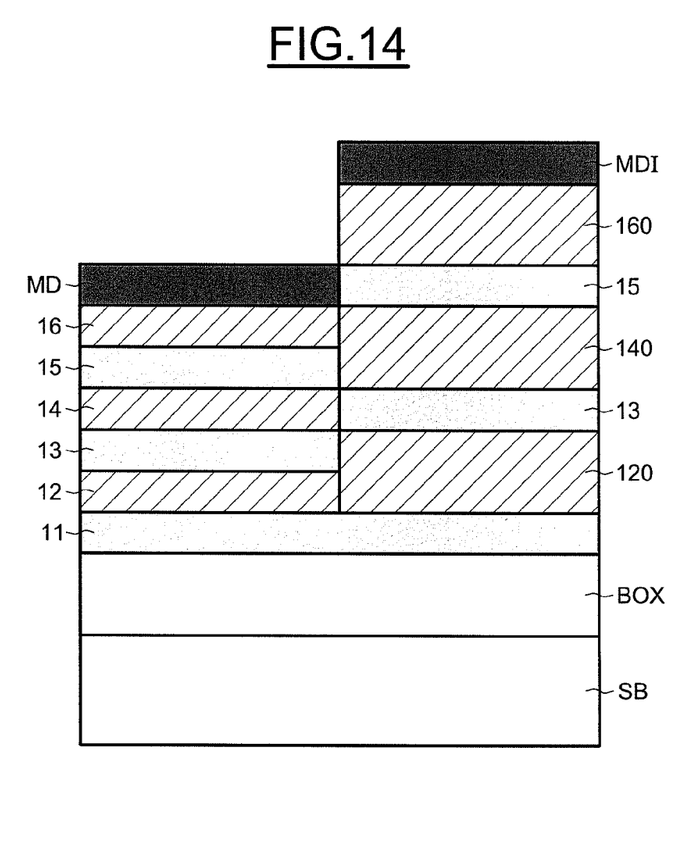

With the first stack of layers corresponding to the NMOS semiconductor device being produced, the intermediate hard mask MDI is removed and a second stack corresponding to the PMOS semiconductor device is then formed. In particular, the second stack is produced with sacrificial layers 120, 140, 160 presenting a thickness that is greater than the sacrificial layers 12, 14, 16 of the first stack. Then, a hard mask MD is deposited on top of the second stack (FIG. 14).

The rest of the method is performed in a way similar to that described hereinabove with reference to FIGS. 3a to 8b and 11a to 12b. In particular, the thickness of the layer of first material 7 will be identical for both types of semiconductor devices, whereas the layer of second material 8, produced by filling the cavities, will be greater or lesser depending on the type of semiconductor device. Thus, after siliciding, there are obtained on the one hand semiconductor devices comprising a gate of NiSi for example and exhibiting an NMOS behavior, and on the other hand semiconductor devices comprising a gate of $Ni_2Si$ and exhibiting a PMOS behavior.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method of fabricating a semiconductor transistor device comprising a semiconductive channel region and a gate region, the gate region comprising at least one buried part extending under the semiconductive channel region, wherein fabricating comprises forming the buried part of the gate region by:
   forming a cavity under the semiconductive channel region,
   performing a first atomic layer deposition of a silicon layer along walls of the cavity,
   performing a second atomic layer deposition of a metal layer over the silicon layer,
   wherein the silicon layer and metal layer only partially fills the cavity leaving a remaining void under the semiconductive channel region, and
   forming a silicide of said metal in the cavity, wherein forming the silicide produces an expansion effect to at least more completely fill the cavity.

2. The method according to claim 1, wherein forming the silicide of said metal comprises annealing.

3. The method according to claim 1, wherein the gate region is totally silicided within the cavity.

4. The method according to claim 1, wherein the first and second atomic layer depositions are controlled to control a relative proportion of silicon to metal in the silicide so as to set a threshold voltage of the semiconductor transistor device.

5. A method of fabricating a semiconductor transistor device comprising a semiconductive channel region and a gate region, the gate region comprising at least one buried part extending under the semiconductive channel region, wherein fabricating comprises forming the buried part of the gate region by:
   forming a cavity under the semiconductive channel region,
   performing a first deposition of a silicon layer along walls of the cavity,
   performing a second deposition of a metal over the silicon layer so as to completely fill the cavity, and
   forming a silicide of said metal in the cavity, wherein forming the silicide produces an expansion effect within the cavity to introduce stress on the semiconductive channel region and increase charge carrier mobility.

6. The method according to claim 5, wherein forming the silicide of said metal comprises annealing.

7. The method according to claim 5, wherein the gate region is totally silicided within the cavity.

8. The method according to claim 5, wherein the first deposition is an atomic layer deposition, and wherein the atomic layer deposition is controlled to control a relative proportion of silicon to metal in the silicide based on volume of the cavity filled by metal so as to set a threshold voltage of the semiconductor transistor device.

9. The method according to claim 8, wherein forming the cavity comprises selecting a size of the cavity relative to the silicon layer to be deposited to set the threshold voltage of the semiconductor transistor device.

10. A method of fabricating an integrated circuit including a first semiconductor transistor device of a first conductivity type and a second semiconductor transistor device of a second conductivity type, each transistor device comprising a semiconductive channel region and a gate region, the gate region comprising at least one buried part extending under the semiconductive channel region, wherein fabricating comprises forming the gate regions by:

forming, on a top surface of a substrate, a stack comprising at least one layer of silicon placed above a sacrificial layer formed from a material that is selectively eliminable relative to the silicon, wherein, in a first region of the stack for the first semiconductor transistor device, the sacrificial layer has a first thickness, wherein, in a first region of the stack for the second semiconductor transistor device, the sacrificial layer has a second thickness different than the first thickness, selective etching to remove at least a portion of the sacrificial layer and form a first cavity in the first region under the layer of silicon and form a second cavity in the second region under the layer of silicon, forming, on walls of the first and second cavities a dielectric material layer, conformally depositing, in the first and second cavities, a layer comprising silicon, conformally depositing, in the first and second cavities, a layer comprising metal over the silicon layer, and forming a silicide of said metal in each of the first and second cavities, the silicide defining first and second gates, respectively, for the first and second semiconductor transistor devices.

11. The method according to claim 10, wherein the first semiconductor transistor device is of the NMOS conductivity type and the second semiconductor transistor device is of the PMOS conductivity type.

12. The method according to claim 11, wherein the second thickness is greater than the first thickness.

13. The method according to claim 11, wherein the metal is nickel, and the first gate silicide phase is rich in silicon compared to nickel, and the second gate silicide phase is rich in nickel compared to silicon.

14. The method according to claim 13, wherein the first semiconductor transistor device with the first gate silicide phase rich in silicon is of the NMOS conductivity type, and wherein the second semiconductor transistor device with the second gate silicide phase rich in nickel is of the PMOS conductivity type.

15. The method according to claim 11, wherein the metal is nickel, and the first gate silicide phase is an NiSi silicide, and the second gate silicide phase is an $Ni_2Si$ silicide.

16. The method according to claim 15, wherein the first semiconductor transistor device with the NiSi first gate silicide phase rich is of the NMOS conductivity type, and wherein the second semiconductor transistor device with the $Ni_2Si$ second gate silicide phase is of the PMOS conductivity type.

17. The method according to claim 10, wherein the first gate has a first gate silicide phase defined by the silicon, metal and size of the first cavity, and the second gate as a second gate silicide phase defined by the silicon, metal and size of the second cavity.

18. The method according to claim 10, wherein forming the silicide comprises annealing.

19. The method according to claim 10, wherein the first and second gates are totally silicided within the first and second cavities.

20. The method according to claim 10, wherein conformally depositing, the layer comprising metal completely fills the first and second cavities, and wherein forming the silicide produces an expansion effect within the first and second cavities to introduce stress on the semiconductive channel region and increase charge carrier mobility.

21. The method according to claim 10, wherein conformally depositing silicon and conformally depositing metal are controlled to control a relative proportion of silicon to metal in the silicide so as to set threshold voltages of the first and second semiconductor transistor devices.

22. A method of fabricating a first semiconductor transistor device and a second semiconductor transistor device, each device comprising a semiconductive channel region and a gate region, the gate region comprising at least one buried part extending under the semiconductive channel region, wherein fabricating comprises:

forming a stack comprising a layer of silicon above a sacrificial layer, wherein, in a first region of the stack for the first semiconductor transistor device, the sacrificial layer has a first thickness, wherein, in a first region of the stack for the second semiconductor transistor device, the sacrificial layer has a second thickness different than the first thickness, forming source/drain regions, etching away the sacrificial layer to form a first cavity in the first region and a second cavity in the second region, wherein the first and second cavities have different sizes, conformally depositing a layer of silicon and a layer of metal in each of the first and second cavities, and annealing to form a silicide of said metal in the cavity, the silicide defining first and second gates, respectively, for the first and second semiconductor transistor devices.

23. The method according to claim 22, wherein the first gate has a first gate silicide phase defined by the silicon, metal and size of the first cavity, and the second gate as a second gate silicide phase defined by the silicon, metal and size of the second cavity.

24. The method according to claim 23, wherein the first semiconductor transistor device is of the NMOS conductivity type and the second semiconductor transistor device is of the PMOS conductivity type.

25. The method according to claim 24, wherein the first semiconductor transistor device has a silicon-rich silicide phase for the first gate, and wherein the second semiconductor transistor device has a metal-rich silicide phase for the second gate.

* * * * *

UNITED STATES PATENT AND TRADEMARK OFFICE
CERTIFICATE OF CORRECTION

| | | |
|---|---|---|
| PATENT NO. | : 7,977,187 B2 | |
| APPLICATION NO. | : 12/372415 | |
| DATED | : July 12, 2011 | |
| INVENTOR(S) | : Bernard et al. | |

It is certified that error appears in the above-identified patent and that said Letters Patent is hereby corrected as shown below:

In the Specification:

At column 1, line number 30, please replace [possib] with -- possible --.

At column 4, line number 49, please replace [MD 10] with -- MD10 --.

Signed and Sealed this
Twentieth Day of September, 2011

David J. Kappos
*Director of the United States Patent and Trademark Office*